(12) United States Patent
Igarashi (10) Patent No.: US 8,937,362 B2
(45) Date of Patent: Jan. 20, 2015

(54) SEMICONDUCTOR DEVICE HAVING A REINFORCING MEMBER FOR FILLING A GAP BETWEEN A SEMICONDUCTOR CHIP AND A COVER MEMBER AND MANUFACTURING METHOD FOR SEMICONDUCTOR DEVICE

(71) Applicant: Olympus Corporation, Tokyo (JP)

(72) Inventor: Takatoshi Igarashi, Nagano (JP)

(73) Assignee: Olympus Corporation, Tokyo (JP)

( * ) Notice: Subject to any disclaimer, the term of this patent is extended or adjusted under 35 U.S.C. 154(b) by 0 days.

(21) Appl. No.: 13/975,578

(22) Filed: Aug. 26, 2013

(65) Prior Publication Data

US 2013/0334643 A1 Dec. 19, 2013

Related U.S. Application Data

(63) Continuation of application No. PCT/JP2011/078683, filed on Dec. 12, 2011.

(30) Foreign Application Priority Data

Mar. 1, 2011 (JP) ................................. 2011-044343

(51) Int. Cl.
*H01L 31/0203* (2014.01)
*H01L 23/16* (2006.01)
*H01L 27/146* (2006.01)

(52) U.S. Cl.
CPC ............ *H01L 31/0203* (2013.01); *H01L 23/16* (2013.01); *H01L 27/14618* (2013.01); *H01L 27/14627* (2013.01); *H01L 2924/0002* (2013.01)
USPC ........................................... 257/433; 438/64

(58) Field of Classification Search
CPC ................ H01L 31/0203; H01L 23/16; H01L 27/14618; H01L 27/14627
USPC ................................................. 257/433; 438/64
See application file for complete search history.

(56) References Cited

U.S. PATENT DOCUMENTS 8,503,186 B2 * 8/2013 Lin et al. ........................ 361/760
2002/0075567 A1 * 6/2002 Kraiczek et al. .............. 359/639

(Continued)

FOREIGN PATENT DOCUMENTS

JP 2002-231919 A 8/2002
JP 2004-296740 A 10/2004

(Continued)

OTHER PUBLICATIONS

International Search Report dated Jan. 24, 2012 issued in PCT/JP2011/078683.

*Primary Examiner* — William D Coleman
(74) *Attorney, Agent, or Firm* — Scully, Scott, Murphy & Presser, P.C.

(57) ABSTRACT

An image pickup apparatus includes a semiconductor chip including a light receiving section, a frame-like spacer arranged on the semiconductor chip to surround the light receiving section, a transparent flat plate section arranged on the semiconductor chip via the spacer and having a plan view dimension larger than a plan view dimension of the spacer and smaller than a plan view dimension of the semiconductor chip, and a reinforcing member for filling a gap between the semiconductor chip and the transparent flat plate section on the outer side of the spacer and having a plan view dimension larger than the plan view dimension of the transparent flat plate section and smaller than the plan view dimension of the semiconductor chip.

15 Claims, 5 Drawing Sheets

(56) References Cited

U.S. PATENT DOCUMENTS

2006/0098244 A1 5/2006 Choi et al.
2008/0003926 A1* 1/2008 Watanabe et al. ............... 451/54

FOREIGN PATENT DOCUMENTS

| JP | 2006-135318 A | 5/2006 |
| JP | 2007-165495 A | 6/2007 |

* cited by examiner

SEMICONDUCTOR DEVICE HAVING A REINFORCING MEMBER FOR FILLING A GAP BETWEEN A SEMICONDUCTOR CHIP AND A COVER MEMBER AND MANUFACTURING METHOD FOR SEMICONDUCTOR DEVICE

CROSS REFERENCE TO RELATED APPLICATION

This application is a continuation application of PCT/JP2011/078683 filed on Dec. 12, 2011 and claims benefit of Japanese Application No. 2011-044343 filed in Japan on Mar. 1, 2011, the entire contents of which are incorporated herein by this reference.

BACKGROUND OF THE INVENTION

1. Field of the Invention

The present invention relates to a semiconductor device in which a semiconductor chip and a cover member are joined via a spacer and a reinforcing member and a manufacturing method for the semiconductor device.

2. Description of the Related Art

For improvement of the reliability of a semiconductor device, an integrated circuit formation region is sometimes sealed. For example, Japanese Patent Application Laid-Open Publication No. 2002-231919 discloses an image pickup apparatus in which a solid-state image pickup device of a substrate section is protected by a sealing section formed by joining the substrate section and a transparent flat plate section via a frame base section and an adhesive layer.

As a method of forming the adhesive layer, a method of injecting an adhesive into a gap and a method of filling the adhesive in joining surfaces in advance and then sticking the joining surfaces together are disclosed.

SUMMARY OF THE INVENTION

A semiconductor device according to an embodiment of the present invention includes: a semiconductor chip including a functional section; a frame-like spacer arranged on the semiconductor chip to surround the functional section; a cover member arranged on the semiconductor chip via the spacer and having a plan view dimension larger than a plan view dimension of the spacer and smaller than a plan view dimension of the semiconductor chip; and a reinforcing member for filling a gap between the semiconductor chip and the cover member on an outer side of the spacer and having a plan view dimension larger than the plan view dimension of the cover member and smaller than the plan view dimension of the semiconductor chip.

A manufacturing method for a semiconductor device according to an another embodiment of the present invention includes: a joining step for joining a semiconductor chip including a functional section and a cover member having a plan view dimension smaller than a plan view dimension of the semiconductor chip via a frame-like spacer arranged on the semiconductor chip to surround the functional section and having a plan view dimension smaller than the plan view dimension of the cover member; and a reinforcing member filling step for filling, with a reinforcing member, a gap between the semiconductor chip and the cover member on the outer side of the spacer.

DETAILED DESCRIPTION OF THE PREFERRED EMBODIMENT

<First Embodiment>

Figure 1:
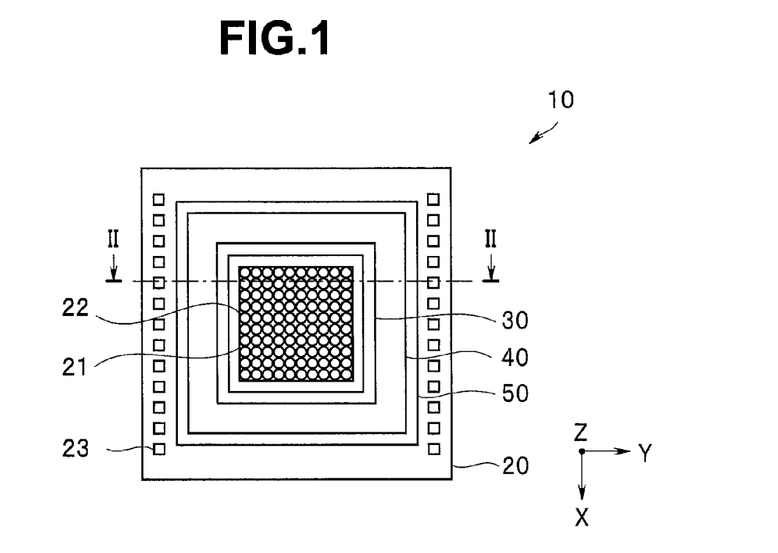
FIG. 1 is a top view of an image pickup apparatus in a first embodiment.
Figure 2:
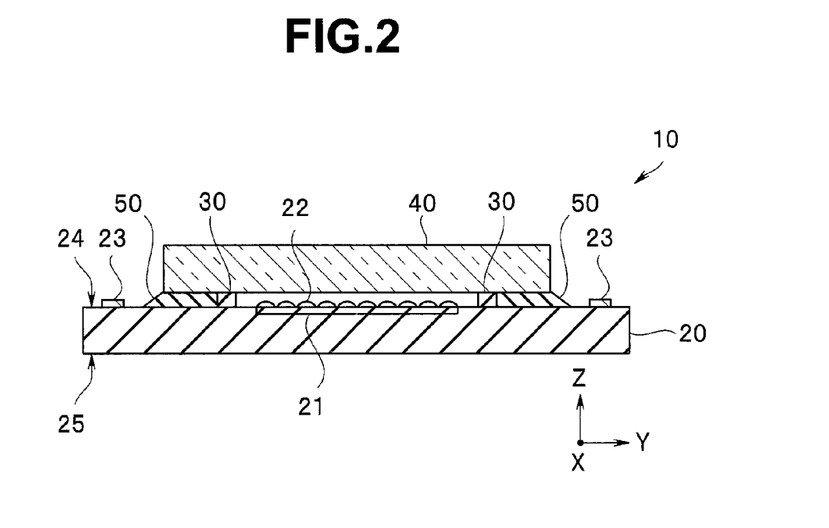
FIG. 2 is a sectional view of the image pickup apparatus in the first embodiment taken along line II-II in FIG. 1.
Figure 3:
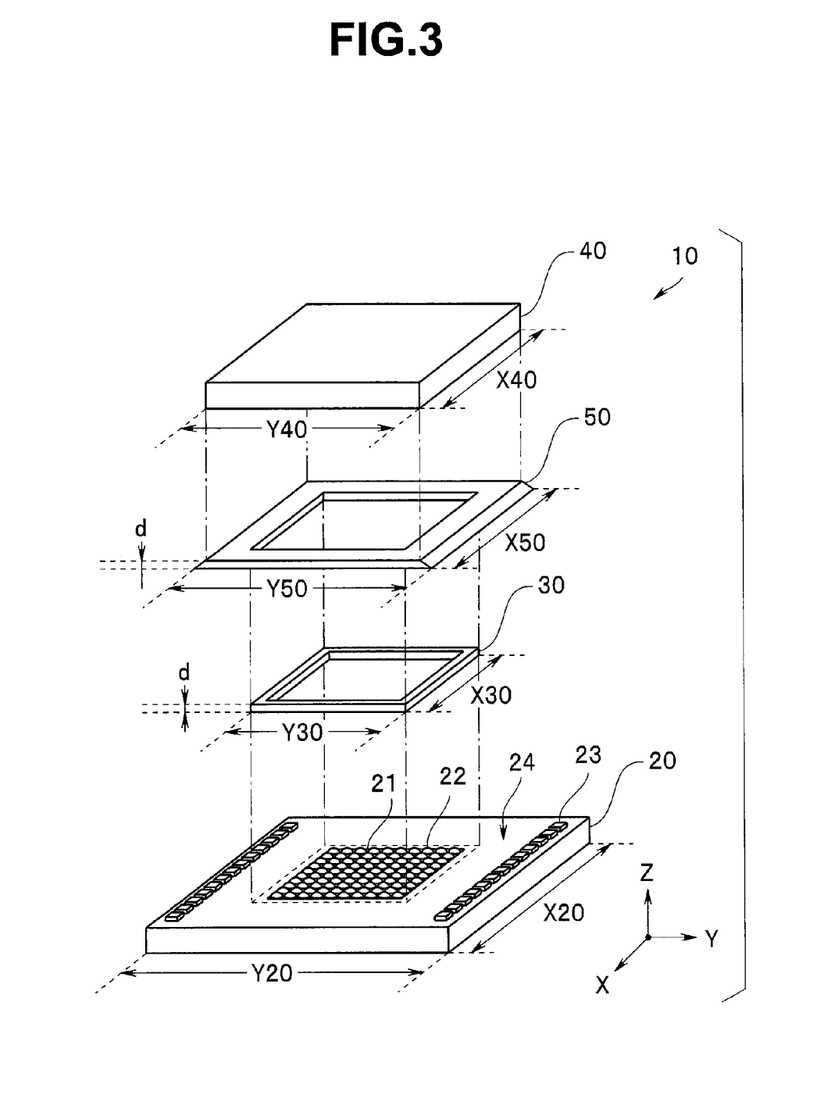
FIG. 3 is an exploded view for explaining the structure of the image pickup apparatus in the first embodiment.

As shown in FIGS. 1 to 3, an image pickup apparatus 10, which is a semiconductor device, in a first embodiment includes a semiconductor chip 20, a spacer 30, a transparent flat plate section 40, which is a cover member, and a reinforcing member 50. As explained below, in the image pickup apparatus 10, the semiconductor chip 20 and the transparent flat plate section 40 are joined via the spacer 30. The reinforcing member 50 is disposed not only to reinforce joining strength of the joining performed via the spacer 30 but also to improve reliability, in particular, prevent penetration of moisture into a light receiving section 21.

The semiconductor chip 20 is a solid-state image pickup device chip including a solid-state image pickup section, which is a functional section, i.e., the light receiving section 21 disposed near the center and a plurality of micro-lenses 22 disposed on the light receiving section 21. The spacer 30 having a frame-like shape is arranged on the semiconductor chip 20 to surround the light receiving section 21. The transparent flat plate section 40 is arranged on the semiconductor chip 20 via the spacer 30.

In the image pickup apparatus 10, the semiconductor chip 20 is made of silicon. The light receiving section 21 configured by a CMOS (complementary metal-oxide semiconductor) image pickup device or the like and a plurality of electrode pads 23 electrically connected to the light receiving section 21 via a wire (not shown in the figure) are formed on a first principal plane 24 by a publicly-known semiconductor process. Further, the micro-lenses 22 are formed on the light receiving section 21.

For the spacer 30, a material that can be processed into a desired shape and has desired mechanical strength is used. For example, silicon or other crystals, ceramics, metal, or Teflon (registered trademark) or other plastics, or the like is used. In particular, a photosensitive adhesive film is desirable because the photosensitive adhesive film is easily processed into a desired shape and can be joined to the transparent flat plate section 40 and the semiconductor chip 20 without using an adhesive or the like.

The material of the transparent flat plate section 40 only has to be transparent in a wavelength band of light for image pickup. For example, glass such as borosilicate glass, quartz glass, sapphire, resin, or other materials can be used.

For the material of the reinforcing member 50, thermosetting resin that is solidified by heating or ultraviolet curing resin that is solidified by ultraviolet ray irradiation is used as a reinforcing member solution in a liquid state. For improvement of the reliability of the image pickup apparatus 10, the reinforcing member 50 is required to have low moisture permeability. Therefore, as the reinforcing member 50, amorphous fluorocarbon resin is preferable and, in particular, perfluoro cyclo amorphous polymer having oxygen atoms, for example, Cytop (registered trademark) is preferable.

A plan view dimension of the transparent flat plate section 40 is larger than a plan view dimension of the spacer 30 and smaller than a plan view dimension of the semiconductor chip 20.

The plan view dimension means dimensions in an X direction and a Y direction of an outer peripheral section of the image pickup apparatus 10 observed from the upper surface (a Z direction in FIG. 3). That is, as shown in FIG. 3, when the plan view dimension of the semiconductor chip 20 is represented as X20, Y20, the plan view dimension of the spacer 30 is represented as X30, Y30, and the plan view dimension of the transparent flat plate section 40 is represented as X40, Y40, X20>X40>X30 and Y20>Y40>Y30. In the image pickup apparatus 10, for example, X30=Y30, $\Delta 40$=(X40−X30)=100 to 500 μm, and $\Delta 20$=(X20−X40)=300 to 500 μm.

The reinforcing member 50 fills a gap between the semiconductor chip 20 and the transparent flat plate section 40 on the outer side of the spacer 30. A part of the reinforcing member 50 spreads over the semiconductor chip 20 as well. Therefore, a plan view dimension X50, Y50 of the reinforcing member 50 is larger than the plan view dimension of the transparent flat plate section 40 and smaller than the plan view dimension of the semiconductor chip 20. That is, X20>X50>X40 and Y20>Y50>Y40.

Thickness d of the spacer 30, which is the thickness of the reinforcing member 50, is set to a value exceeding the height of the micro-lenses 22 to prevent the micro-lenses 22 provided on the light receiving section 21 and the transparent flat plate section 40 from coming into contact with each other. Note that the thickness d is preferably small in order to prevent moisture penetration into a sealed space surrounded by the transparent flat plate section 40, the spacer 30, and the semiconductor chip 20.

In the image pickup apparatus 10, as the reinforcing member 50, a reinforcing member solution is solidified after being filled in the gap between the semiconductor chip 20 and the transparent flat plate section 40 by the capillary phenomenon. That is, when the reinforcing member solution is dropped on the outer periphery of the transparent flat plate section 40, the reinforcing member solution fills the gap according to the capillary phenomenon. Therefore, the reinforcing member surely fills the gap without leaving air bubbles. In order to fill the reinforcing member solution in the gap according to the capillary phenomenon, the thickness d of the gap is preferably equal to or smaller than 50 um.

Further, when humidity resistance is taken into account, the gap preferably has the thickness d of 10 to 50 μm and depth $\Delta 40$ of 100 to 500 μm.

That is, if the thickness d is equal to or larger than the range lower limit, normal micro-lenses 22 having height smaller than 10 μm can be housed. If the thickness d is equal to or smaller than the range upper limit and the depth $\Delta 40$ is within the range, the gap can be filled by the capillary phenomenon and desired reliability can be secured.

As the reinforcing member solution, a low viscosity solution is selected to be satisfactorily filled in the gap between the transparent flat plate section 40 and the semiconductor chip 20 by the capillary phenomenon. The viscosity coefficient of the reinforcing member solution is preferably $10^1$ to $10^4$ mPa·s and particularly preferably $10^1$ to $10^2$ mPa·s.

Note that, in an image pickup apparatus in which the plan view dimensions of the transparent flat plate section 40 and the semiconductor chip 20 are the same, in other words, end faces thereof are aligned, the image pickup apparatus is arranged such that the gap to be filled is placed on the upper surface. Further, rotating operation is also necessary in order to apply the low viscosity solution to four side surfaces. Therefore, it is not easy to apply the low viscosity solution to the side surfaces.

On the other hand, in the image pickup apparatus 10 in which the plan view dimension of the semiconductor chip 20 is larger than the plan view dimension of the transparent flat plate section 40, it is possible to easily fill the low viscosity solution in the gap by applying the low viscosity solution to the semiconductor chip 20 in the outer periphery of the transparent flat plate section 40. Since an excess solution spreads to be held on the semiconductor chip 20, it is easy to apply the low viscosity solution.

Since the gap between the semiconductor chip 20 and the transparent flat plate section 40 can be easily and surely sealed, the image pickup apparatus 10 has high airtightness/water tightness and has high reliability of the apparatus itself, in particular, moisture proof reliability/water proof reliability.

In the publicly-known image pickup apparatus in which the semiconductor chip and the transparent flat plate section have the same plan view dimension, in order to mount the image pickup apparatus on a wiring board, it is necessary to manufacture a through-wire piercing through the semiconductor chip and manufacture rear surface electrode pads on a second principal plane (a rear surface) 25.

On the other hand, in the image pickup apparatus 10, the plan view dimension of the transparent flat plate section 40 is larger than the plan view dimension of the spacer 30 and smaller than the plan view dimension of the semiconductor chip 20. The plan view dimension of the reinforcing member 50 is larger than the plan view dimension of the transparent flat plate section 40 and smaller than the plan view dimension of the semiconductor chip 20.

Therefore, in the image pickup apparatus 10, the semiconductor chip 20 includes, on the outer side of the reinforcing member 50 of the first principal plane 24, the electrode pads 23 connected to the light receiving section 21 formed on the first principal plane (a front surface) 24. Therefore, when the image pickup apparatus 10 is mounted on the wiring board, the electrode pads 23 and connection lands on the wiring board can be connected by wire bonding, flip-chip bonding, or the like.

That is, since the image pickup apparatus 10 has the electrode pads 23 on the first principal plane 24, the image pickup apparatus 10 can be mounted on the wiring board using various mounting methods.

Figure 4:
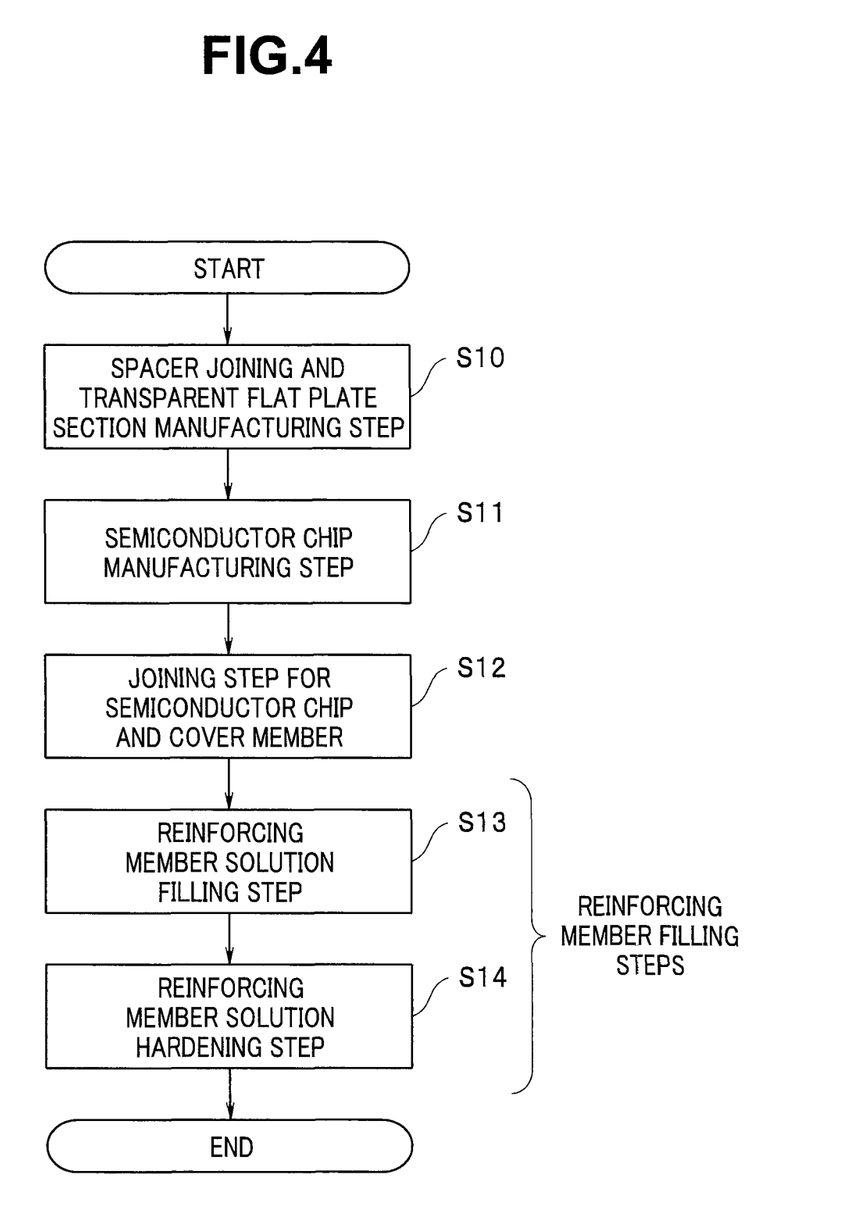
FIG. 4 is a flowchart for explaining a manufacturing method for the image pickup apparatus in the first embodiment.

Next, a manufacturing method for the image pickup apparatus 10 is explained using FIG. 4.

<Step S10>

First, a photosensitive resin film functioning as the spacer 30 is stuck to a glass wafer for manufacturing a plurality of the transparent flat plate sections 40. The photosensitive resin film is processed into a plurality of the spacers 30 by photolithography. Subsequently, the glass wafer is cut to have an outside dimension larger than the spacer 30 and smaller than the semiconductor chip 20. That is, the plurality of transparent flat plate sections 40, to which the spacers 30 are joined, are manufactured from one glass wafer.

<Step S11>

On the other hand, as the semiconductor chip 20, a large number of chips are collectively manufactured by a publicly-known process using a silicon wafer and then singulated.

<Step S12>

The transparent flat plate section 40, to which the spacer 30 is joined, and the semiconductor chip 20 are stuck together such that the spacer 30 surrounds the light receiving section 21 of the semiconductor chip 20 and are further subjected to heat treatment to be joined.

That is, a joining step for joining the semiconductor chip having the functional section and the cover member smaller than the plan view dimension of the semiconductor chip via the frame-like spacer arranged on the semiconductor chip to surround the functional section and smaller than the plan view dimension of the cover member is performed.

<Step S13>

Subsequently, when an amorphous fluorocarbon resin solution, which is a reinforcing member solution, is applied to the outer periphery of the transparent flat plate section, the amorphous fluorocarbon resin solution is filled in the gap between the transparent flat plate section and the solid-state image pickup device by the capillary phenomenon.

As an application method, for example, a dispense method for squeezing out a solution from a distal end nozzle of a dispenser is used.

The plan view dimension of the transparent flat plate section 40 is set larger than the spacer 30 and smaller than the semiconductor chip 20. Therefore, when the reinforcing member 50 is filled, the reinforcing member 50 can be easily filled in the gap by the capillary phenomenon simply by dropping the reinforcing member solution on the peripheral section of the transparent flat plate section 40 on the semiconductor chip 20.

As explained above, a solution filling step for filling the reinforcing member solution in the gap according to the capillary phenomenon is performed.

<Step S14>

The reinforcing member 50 made of solid amorphous fluorocarbon resin is obtained by subjecting the amorphous fluorocarbon resin solution to hardening treatment by heat treatment or ultraviolet ray irradiation treatment. That is, a hardening step for solidifying the reinforcing member solution is performed.

As explained above, as a reinforcing member filling step for filling the gap between the semiconductor chip and the cover member on the outer side of the spacer with the reinforcing member, the solution filling step for filling the reinforcing member solution in the gap according to the capillary phenomenon and the hardening step for solidifying the reinforcing member solution are performed.

In the above explanation, an example in which the transparent flat plate section 40, to which the spacer 30 is joined, is joined to the semiconductor chip 20 is explained. However, the semiconductor chip 20, to which the spacer 30 is joined, may be joined to the transparent flat plate section 40.

With the manufacturing method for the semiconductor device in the present embodiment, it is possible to manufacture the image pickup apparatus 10 having high reliability.

<Second Embodiment>

Figure 5:
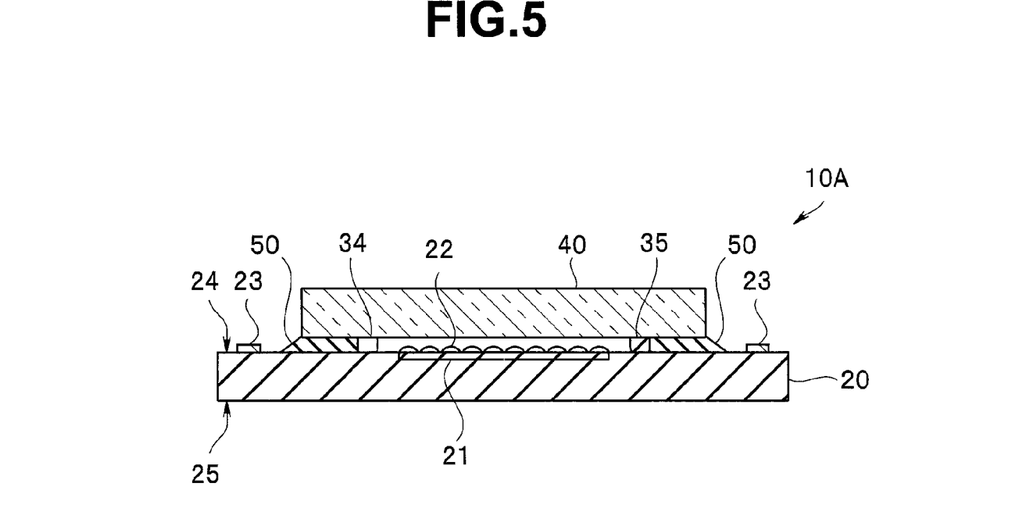
FIG. 5 is a sectional view of an image pickup apparatus in a second embodiment.

Next, an image pickup apparatus 10A, which is a semiconductor device, in a second embodiment of the present invention is explained. Since the image pickup apparatus 10A is similar to the image pickup apparatus 10, the same components are denoted by the same reference numerals and signs and explanation of the components is omitted.

Figure 6:
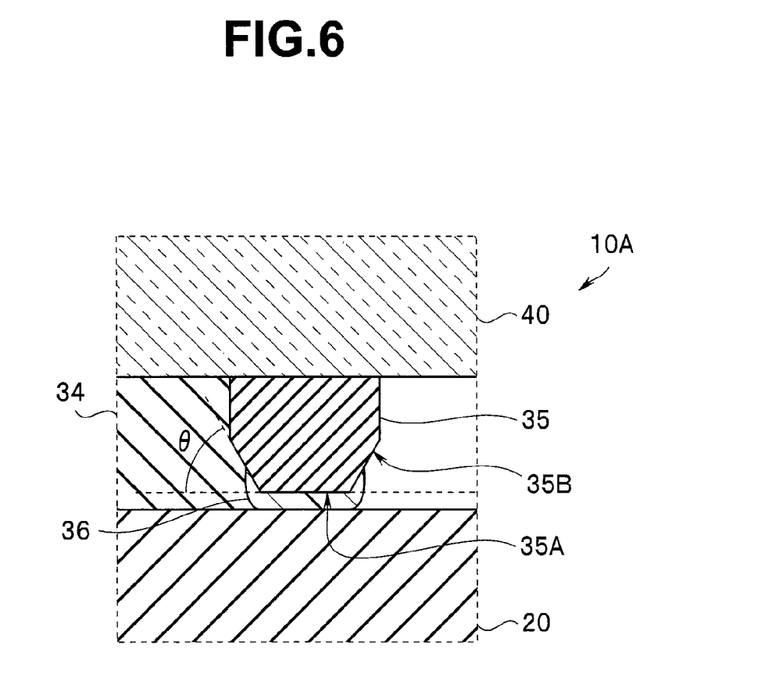
FIG. 6 is a partial sectional view for explaining a manufacturing method for the image pickup apparatus in the second embodiment.

As shown in FIGS. 5 and 6, the structure of the image pickup apparatus 10A is similar to the structure of the image pickup apparatus 10. However, in the image pickup apparatus 10A, a spacer 35 is made of monocrystalline silicon. Therefore, the spacer 35 is joined to the transparent flat plate section 40 by an anodic bonding method and joined to the semiconductor chip 20 by an adhesive 36.

The spacer 35 is joined to the semiconductor chip 20 by the adhesive 36. Therefore, it is likely that an image failure of the image pickup apparatus occurs because the adhesive 36 oozes out to the region of the light receiving section 21 during joining.

Therefore, a tapered surface 35B having a Miller index (111) is formed on an end face 35A having a Miller index (100) at an end of the spacer 35 in contact with the semiconductor chip 20.

In the image pickup apparatus 10A, since the tapered surface 35B is provided on the end face 35A at the spacer end, even if the adhesive 36 oozes out during the joining, the adhesive 36 is stored in a space formed by the tapered surface 35B. Therefore, the adhesive 36 does not ooze out to the region of the light receiving section 21.

The spacer 35 made of silicon has extremely low moisture permeability compared with the spacer made of the resin material.

Therefore, the image pickup apparatus 10A has the effects of the image pickup apparatus 10. Reliability of the image pickup apparatus 10A is higher and it is unlikely that an image failure of the image pickup apparatus occurs.

Next, a manufacturing method for the image pickup apparatus 10A is explained using FIG. 6 and FIGS. 7A to 7F. Note that FIGS. 7A to 7F are sectional schematic views of a region including two transparent flat plate sections 40 to which the spacers 35 are joined. FIG. 6 is a partial sectional view of a joined portion of the transparent flat plate section 40, the spacer 35, and the semiconductor chip 20.

Figure 7A:
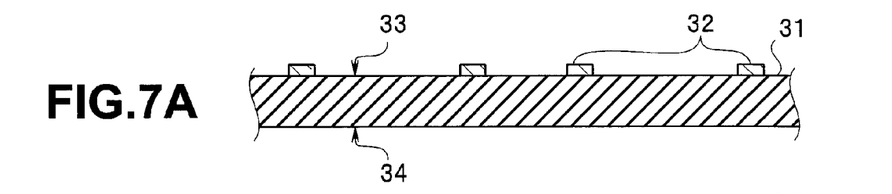
FIG. 7A is a partial sectional view for explaining the manufacturing method for the image pickup apparatus in the second embodiment.

As shown in FIG. 7A, a photoresist 32 is patterned in the shape of the spacer 35, i.e., in a frame shape on a first principal plane 33 of a wafer 31 made of monocrystalline silicon, a Miller index of which is (100).

Figure 7B:
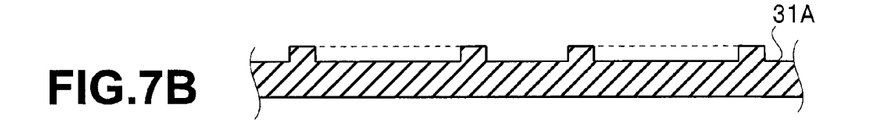
FIG. 7B is a partial sectional view for explaining the manufacturing method for the image pickup apparatus in the second embodiment.

As shown in FIG. 7B, dry etching is performed by an ICP-RIE method using the photoresist 32 as an etching mask. Then, a concave portion having depth of 60 μm to 100 μm is formed on the first principal plane 33 of the wafer 31 while leaving a frame-like convex portion.

That is, a step for pattern-etching the first principal plane 33 of the wafer 31 made of monocrystalline silicon, a Miller index of a principal plane of which is (100), to manufacture a wafer 31A on which the frame-like convex portion is formed is performed.

Figure 7C:
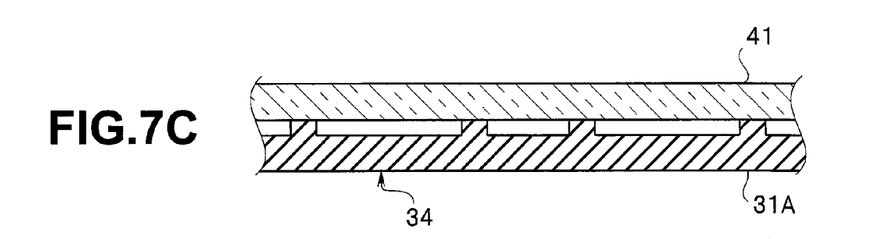
FIG. 7C is a partial sectional view for explaining the manufacturing method for the image pickup apparatus in the second embodiment.

As shown in FIG. 7C, the first principal plane 33 of the wafer 31A and a glass wafer 41 are subjected to anodic bonding.

That is, a step for joining the first principal plane 33 of the wafer 31A to a translucent substrate 41 to manufacture a joined substrate is performed.

Figure 7D:
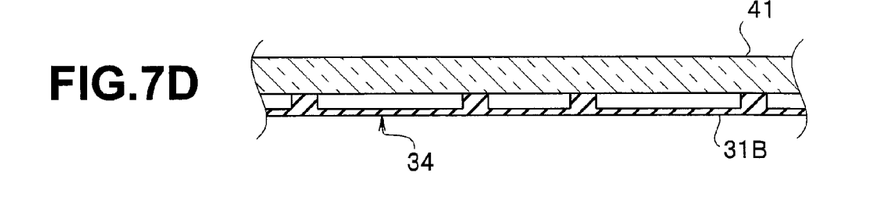
FIG. 7D is a partial sectional view for explaining the manufacturing method for the image pickup apparatus in the second embodiment.

As shown in FIG. 7D, back grind treatment for the joined substrate, i.e., polishing of a second principal plane (a rear surface) 34 of the wafer 31A is performed. The back grind treatment is performed until a wafer 31B having thickness for not opening the concave portion, for example, thickness of "the depth of the concave portion+10 µm" is obtained.

Figure 7E:
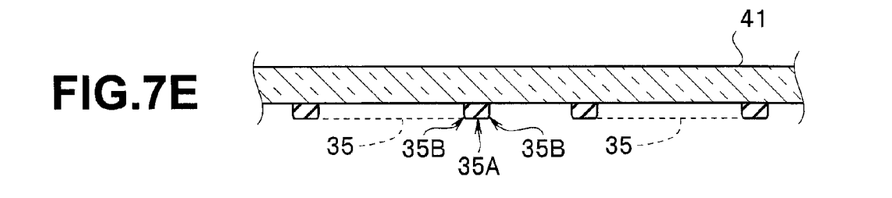
FIG. 7E is a partial sectional view for explaining the manufacturing method for the image pickup apparatus in the second embodiment.

As shown in FIG. 7E, wet etching is performed from the second principal plane 34 side of the wafer 31B of the joined substrate using an alkali solution such as KOH or TMAH.

In the wet etching of the silicon wafer having a Miller index (100) by the alkali solution, when the concave portion is exposed, the tapered surface 35B having the Miller index (111) is formed on the end face 35A having the Miller index (100) at the end. This is because wet etching speed of the Miller index (111) surface of silicon is extremely low at about $1/100$ compared with etching speed of the Miller index (100) surface.

As explained above, a step for etching the joined substrate from the second principal plane side of the wafer made of the monocrystalline silicon having the Miller index (100) and forming the frame-like spacer 35 having the end, where the end face having the Miller index (100) with the tapered surface having the Miller index (111) formed thereon is present, is performed.

In the wet etching method, unlike a mechanical machining method such as polishing, silicon is removed while being gradually melted. Therefore, unlike the mechanical machining method, large broken pieces do not collide with the glass wafer 41. Therefore, the glass wafer 41 is neither scratched nor stained.

Figure 7F:
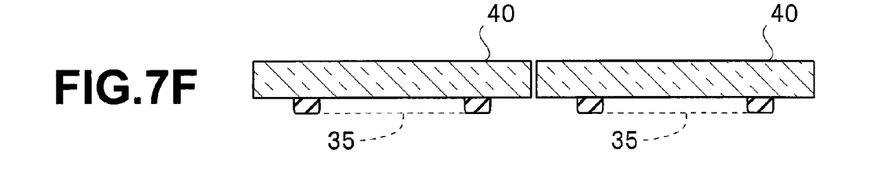
FIG. 7F is a partial sectional view for explaining the manufacturing method for the image pickup apparatus in the second embodiment.

As shown in FIG. 7F, the glass wafer 41, to which a plurality of the spacers 35 are joined, is cut, whereby a plurality of the transparent flat plate sections 40, to which the spacers 35 are joined, are manufactured.

A manufacturing method for the semiconductor chip 20 is the same as the manufacturing method for the image pickup apparatus 10.

As shown in FIG. 6, the transparent flat plate section 40, to which the spacer 35 is joined, is aligned such that the spacer 35 surrounds the light receiving section 21 of the semiconductor chip 20. The spacer 35 is joined to the semiconductor chip 20 by the adhesive 36. As the adhesive 36, for example, ultraviolet curing resin or thermosetting resin is used. The adhesive 36 is supplied by a dispense method, a printing method, or a transfer method.

That is, a joining step for joining the semiconductor chip having the plan view dimension larger than the spacer 35 and including the functional section to the joined substrate using the adhesive 36 such that the functional section is stored on the inside of the spacer 35 is performed.

When semiconductor chip is joined using the adhesive 36 while being compression-bonded, it is likely that an excess unhardened adhesive 36 flows out to the light receiving section 21. However, in the image pickup apparatus 10A, since the tapered surface 35B is provided on the end face 35A at the spacer end, it is possible to prevent an image failure of the image pickup apparatus caused when the adhesive 36 oozes out to the region of the light receiving section 21.

Note that the effect is conspicuous if an angle θ formed by the end face 35A and the tapered surface 35B is 30 degrees to 70 degrees.

In particular, in the spacer 35 in which the mono crystalline silicon, the Miller index of the principal plane of which is (100), is wet-etched to form the end where the end face 35A having the Miller index (100) is present, the angle θ is always 54.7 degrees. Therefore, manufacturing of the spacer 35 is easy.

Further, as in the manufacturing method for the image pickup apparatus 10, a reinforcing member filling step for filling the reinforcing member in the gap between the semiconductor chip and the translucent substrate on the outer side of the spacer section including a solution filling step for filling a reinforcing member solution in the gap according to the capillary phenomenon and a hardening step for solidifying the reinforcing member solution is performed. Consequently, the image pickup apparatus 10A is completed.

With the image pickup apparatus 10A and the manufacturing method for the image pickup apparatus 10A in the present embodiment, it is possible to manufacture, with high yield, the image pickup apparatus 10A having effects same as the effects of the image pickup apparatus 10 and the like in the first embodiment and having higher reliability.

The present invention is not limited to the embodiments explained above and various alterations, modifications, and the like of the embodiments can be made without departing from the spirit of the invention.

What is claimed is:

1. A semiconductor device comprising:
   an image pickup device chip including a light receiving element section;
   a frame-like spacer arranged on the image pickup device chip to surround the light receiving element section;
   a cover member formed of a transparent flat plate, arranged on the image pickup device chip via the spacer and having a plan view dimension larger than a plan view dimension of the spacer and smaller than a plan view dimension of the image pickup device chip; and
   a reinforcing member for filling a gap between the image pickup device chip and the cover member on an outer side of the spacer and having a plan view dimension larger than the plan view dimension of the cover member and smaller than the plan view dimension of the image pickup device chip.

2. The semiconductor device according to claim 1, wherein the reinforcing member is formed by filling a reinforcing member solution in the gap by a capillary phenomenon and solidifying the reinforcing member solution.

3. The semiconductor device according to claim 1, wherein the cover glass forms an enclosure defined by a surface of the chip, an opposing surface of the cover glass and an inner peripheral surface of the spacer.

4. The semiconductor device according to claim 1, wherein the gap is defined by a surface of the chip, an opposing surface of the cover glass and an outer peripheral surface of the spacer.

5. The semiconductor device according to claim 2, wherein the reinforcing member is made of amorphous fluoropolymer.

6. The semiconductor device according to claim 5, wherein the image pickup device chip includes, on an outer side of the reinforcing member, on the first principal plane, an electrode pad connected to the light receiving element section formed on the first principal plane.

7. The semiconductor device according to claim 6, wherein a tapered surface having a Miller index (111) is formed on an end face having a Miller index (100) at an end of the spacer, which is made of monocrystalline silicon, in contact with the image pickup device chip.

8. A manufacturing method for a semiconductor device comprising:

a joining step for joining an image pickup device chip including a light receiving element section, and a cover member made of a transparent flat plate and having a plan view dimension smaller than a plan view dimension of the semiconductor chip via a frame-like spacer arranged on the image pickup device chip to surround the light receiving element section and having a plan view dimension smaller than the plan view dimension of the cover member; and a reinforcing member filling step for filling, with a reinforcing member, a gap between the image pickup device chip and the cover member on an outer side of the spacer.

9. The manufacturing method for the semiconductor device according to claim 8, wherein the reinforcing member filling step includes a solution filling step for filling a reinforcing member solution in the gap according to a capillary phenomenon and a hardening step for solidifying the reinforcing member solution.

10. The manufacturing method for the semiconductor device according to claim 9, wherein the reinforcing member is made of amorphous fluoropolymer.

11. The manufacturing method for the semiconductor device according to claim 10, wherein the image pickup device chip includes, on an outer side of the reinforcing member, an electrode pad connected to the light receiving element section.

12. A manufacturing method for a semiconductor device comprising:

a step for pattern-etching a first principal plane of a wafer made of monocrystalline silicon, a Miller index of a principal plane of which is (100), to form a frame-like convex portion;

a step for joining the first principal plane of the wafer to the cover member to manufacture a joined substrate;

a step for etching the joined substrate from a second principal plane side of the wafer to form a frame-like spacer including an end where an end face having a Miller index (100) with a tapered surface having a Miller index (111) formed thereon is present;

a joining step for joining an image pickup device chip including a light receiving element section and larger than a plan view dimension of the spacer to the joined substrate using an adhesive such that the light receiving element section is stored on an inside of the spacer; and a reinforcing member filling step for filling a reinforcing member in a gap between the image pickup device chip and the cover member on an outer side of the spacer.

13. The manufacturing method for the semiconductor device according to claim 12, wherein the reinforcing member filling step includes a solution filling step for filling a reinforcing member solution in the gap according to a capillary phenomenon and a hardening step for solidifying the reinforcing member solution.

14. The manufacturing method for the semiconductor device according to claim 13, wherein the reinforcing member is made of amorphous fluoropolymer.

15. The manufacturing method for the semiconductor device according to claim 14, wherein the image pickup device chip includes, on an outer side of the reinforcing member, an electrode pad connected to the light receiving element section.

* * * * *